US006815976B2

(12) United States Patent
Taquchi

(10) Patent No.: US 6,815,976 B2
(45) Date of Patent: Nov. 9, 2004

(54) APPARATUS AND METHOD FOR INSPECTING ARRAY SUBSTRATE

(75) Inventor: Tomoaki Taquchi, Kustasu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/629,130

(22) Filed: Jul. 29, 2003

(65) Prior Publication Data

US 2004/0100287 A1 May 27, 2004

(51) Int. Cl.7 .......................... G01R 31/00; G09G 3/36
(52) U.S. Cl. .......................................... 324/770; 345/87
(58) Field of Search ................................ 324/770, 678; 345/87, 92; 349/38, 42, 43; 348/180, 177, 189; 438/14

(56) References Cited

U.S. PATENT DOCUMENTS 5,235,448 A * 8/1993 Suzuki et al. ................. 349/43
6,078,365 A * 6/2000 Ueda et al. ................... 349/43
6,714,183 B2 * 3/2004 Yamazaki et al. ............ 345/98

* cited by examiner

*Primary Examiner*—Ernest Karlsen
(74) *Attorney, Agent, or Firm*—Derek S. Jennings; Anne V. Dougherty

(57) ABSTRACT

An object of the present invention is to provide an apparatus and a method for detecting a defective pixel caused by a punch-through voltage that cannot be detected by a conventional apparatus for inspecting an array substrate. An apparatus for inspecting an array substrate according to the present invention comprises: means for applying a first voltage VGH1 to switching elements so as to accumulate electric charges in storage capacitors and gate-electrode capacitors of the array substrate; and means for applying a second voltage VGH2 having a different voltage value than the first voltage VGH1 has to the switching elements when the electric charges accumulated in the storage capacitors and the gate-electrode capacitors are read.

12 Claims, 5 Drawing Sheets

APPARATUS AND METHOD FOR INSPECTING ARRAY SUBSTRATE

FIELD OF THE INVENTION

The present invention relates to an apparatus and a method for inspecting an array substrate of a liquid crystal display (LCD).

BACKGROUND OF THE INVENTION

An array substrate of an LCD in FIG. 3 is a well-known array substrate which comprises: a substrate; a plurality of gate lines 12 provided on the substrate; a plurality of data lines 14 that cross the gate lines 12 through an insulating layer; switching elements 16 provided near the intersections of the gate lines 12 and the data lines 14 and connected to the gate lines 12 and the data lines 14; pixel electrodes 18 connected to the switching elements 16; storage capacitor (Cs) lines that form storage capacitors 26 by facing a part of the each pixel electrode 18 through an insulating layer; and gate-electrode capacitors 24 formed between the gate lines 12 and the pixel electrodes 18. In this specification, the pixel electrode 18 is indium tin oxide (ITO).

Array substrates of an LCD are produced by etching and depositing various materials over and over again. They are inspected after the production, and non-defective ones are used in an LCD. As shown in FIG. 3, an inspecting apparatus 11 comprises: a gate voltage generating circuit 29 connected to a pad 34 of the gate line 12 through a probe 38; a write circuit 30 for applying a write voltage to the data line 14; a read circuit 32 for reading electric charges accumulated in the gate-electrode capacitor 24 and the storage capacitor 26; a switch 42 for selecting the write circuit 30 or the read circuit 32; and a probe 40 connected to the pad 36 of the data line 14.

In general, the voltage applied to the pixel electrode 18 is $\Delta V$ lower than a desired voltage to be applied, depending on the storage capacitor 26 and a liquid crystal capacitor. Such voltage difference $\Delta V$ is hereinafter referred to as a "punch-through voltage". If the punch-through voltages $\Delta V$ of all the pixels are constant, the voltage to be applied to the pixel electrode 18 is increase by $\Delta V$ so that all the pixels can function normally.

As the capacitance of the gate-electrode capacitor 24 increases due to foreign matter attached on the array substrate or defects in the array substrate, the punch-through voltage $\Delta V$ gets higher than that of a normal pixel. This causes malfunctions of the LCD. For example, when electric charges are accumulated in the gate-electrode capacitor 24 and the storage capacitor 26 and then the switching element 16 is turned off, the electric charge accumulated in the storage capacitor 26 is transferred to the gate-electrode capacitor 24 and thus the storage capacitor 26 cannot retain desired electric charge.

If the amount of change in gate potential is $\Delta Vg=(VGH-VGL)$ and a capacitance of a liquid crystal capacitor is Clc, the punch-through voltage $\Delta V$ can be expressed by $\Delta V=\Delta Vg\times Cgd/(Cgd+Clc+Cs)$. In this specification, Cs and Cgd indicate capacitances of the storage capacitor 26 and the gate-electrode capacitor 24, respectively, VGH and VGL indicate a voltage to be applied to the gate line 12, and VGH is higher than VGL and turns on the switching element 16.

An electric charge Q is measured as follows. As shown in FIG. 4(*a*), an inspecting apparatus applies a gate voltage VGH. When the electric charges are written (T1), the conditions of the electric charges are expressed by $Qgd=Cgd(VD-VGH)$ and $Qcs=Cs(VD-VCs)$. In this specification, the phrase "electric charges are written" means that the electric charges Qgd and Qcs are accumulated in the gate-electrode capacitor 24 and the storage capacitor 26, respectively. In addition, VD indicates a write voltage to be applied to the data line 14 shown in FIG. 4(*b*) and Vcs indicates a voltage to be applied to the storage capacitor (Cs) line 20.

When the electric charges are retained (T2), the conditions of the electric charges are expressed by $Qgd=Cgd(VITO-VGL)$ and $Qcs=Cs(VITO-VCs)$, wherein VITO indicates a voltage to be applied to the pixel electrode 18.

When the electric charges are read (T3), the conditions of the electric charges are expressed by $Qgd=Cgd(GND-VGH)$ and $Qcs=Cs(GND-VCs)$, wherein GND indicates an earth potential.

The electric charge Q to be detected in the inspection of the array substrate are determined by subtracting the total amount of electric charges in a read operation from the total amount of electric charges in a write operation, and is expressed by $Q=VD(Cs+Cgd)$. In the aforementioned expression, the capacitance of a data-electrode capacitor 44 shown in FIG. 5 is neglected.

If Cs is 0.1 pF, Cgd is 0.01 pF, and a write voltage VD is 10V, the electric charge Q to be detected in a normal pixel is 1.1 pC.

In a defective pixel caused by a punch-through voltage failure, Cgd is 0.02 pF which is twice as much as that in a normal pixel. However, the electric charge Q detected in that defective pixel is 1.2 pC. Thus, the difference in electric charge between the normal pixel and the defective pixel is less than 10%, which is not sufficient enough to judge that Cdg falls outside a normal range, allowing for noise of the inspecting apparatus itself.

Further, it is also difficult to detect a capacitance of the data-electrode capacitor 44 shown in FIG. 5 using the aforementioned technique, because no electric charges are accumulated in the data-electrode capacitor 44 in the write operation (T1) and therefore no electric charges are left in the read operation (T3).

More specifically, voltages to be applied to the gate line 12 and the data line 14 in the write and read operations are the same as those shown in FIG. 4. If the capacitance of the gate-electrode capacitor 24 is neglected, an electric charge Qw in the write operation is expressed by $Qw=Cs(VITO-VCs)+Cdd(VITO-VD)$ and an electric charge Qr in the read operation is expressed by $Qr=Cs(GND-VCs)+Cdd(GND-GND)$. In the aforementioned expressions, Cdd indicates a capacitance of the data-electrode capacitor 44. Therefore, the electric charge Q to be detected is expressed by $Q=Cs(VITO-GND)+Cdd(VITO-VD)$.

If VGH is sufficiently high, for example, VD+5V or more, VITO=VD. Therefore, the electric charge Q to be detected is expressed by $Q=(VITO-GND)$ and thus Cdd is not included. Since the capacitance of the data-electrode capacitor 44 cannot be detected during the inspection, even if the capacitance of the data-electrode capacitor 44 is not the normal value, the array substrate cannot be judged as defective.

Japanese Unexamined Patent Publication No. (Patent Kokai No.) 11-183550 (1999) discloses an apparatus for inspecting an array substrate. In this apparatus, an electric charge is accumulated in a pixel and then read after predetermined time. This is effective when a silicon etching residue is left between a pixel electrode and a common electrode. However, unlike the present invention, this publication does not disclose that a gate voltage is changed in write and read operations.

Accordingly, an object of the present invention is to provide an apparatus and a method for detecting a defective pixel caused by a punch-through voltage that cannot be detected by a conventional apparatus for inspecting an array substrate.

SUMMARY OF THE INVENTION

An apparatus for inspecting an array substrate according to the present invention comprises: means for applying a first voltage to switching elements so as to turn on the switching elements when electric charge is accumulated in storage capacitors and gate-electrode capacitors of the array substrate; and means for applying a second voltage having a different voltage value than the first voltage has to the switching elements so as to turn on the switching elements when the electric charge accumulated in the storage capacitors and the gate-electrode capacitors is read.

A method for inspecting an array substrate according to the present invention comprises the steps of applying a first voltage to switching elements so as to turn on the switching elements when electric charge is accumulated in storage capacitors and gate-electrode capacitors; and applying a second voltage having a different voltage value than the first voltage has to the switching elements so as to turn on the switching elements when the electric charge accumulated in the storage capacitors and the gate-electrode capacitors is read.

The present invention makes it easy to detect a capacitance of a gate-electrode capacitor, which was difficult to detect in a conventional invention, by applying a different gate voltage in write and read operations, and also makes it possible to detect a defective pixel caused by a punch-through voltage. Further, in the present invention, it is possible to detect the capacitance of the data-electrode capacitor by adjusting a gate voltage.

BRIEF DESCRIPTION OF THE DRAWINGS

The invention will hereinafter be described in greater detail with specific reference to the appended drawings wherein.

DESCRIPTION OF THE PREFERRED EMBODIMENTS

Embodiments of the apparatus and the method for inspecting an array substrate according to the present invention will be described below with reference to the accompanying drawings.

Figure 1:
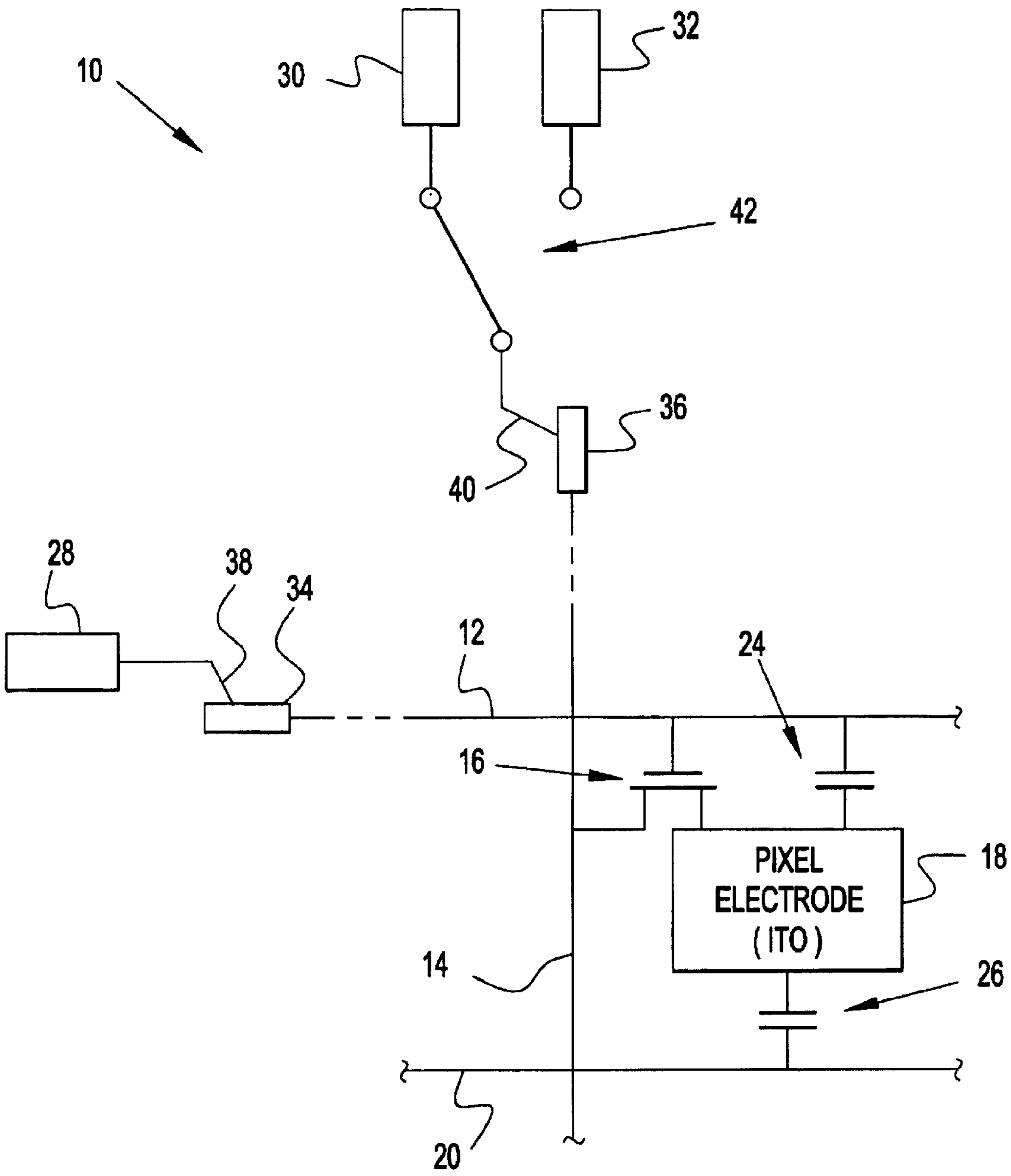
FIG. 1 shows an embodiment of an apparatus for inspecting an array substrate according to the present invention and a pixel circuit for a liquid crystal display.

An array substrate of an LCD to be inspected according to the present invention is a well-known array substrate. As shown in FIG. 1, an array substrate comprises: a substrate; a plurality of gate lines 12 provided on the substrate; a plurality of gate lines 14 that cross the gate lines 12 through an insulating layer; switching elements 16 provided near the intersections of the gate lines 12 and the data lines 14 and connected to the gate lines 12 and the data lines 14; pixel electrodes 18 connected to the switching elements 16; storage capacitor lines 20 that form storage capacitors 26 by facing a part of the each pixel electrode 18 through an insulating layer; and gate-electrode capacitors 24 formed between the gate lines 12 and the pixel electrodes 18. In this specification, the pixel electrode 18 is indium tin oxide (ITO) and the switching element 16 is a thin film transistor (TFT).

Figure 2A:
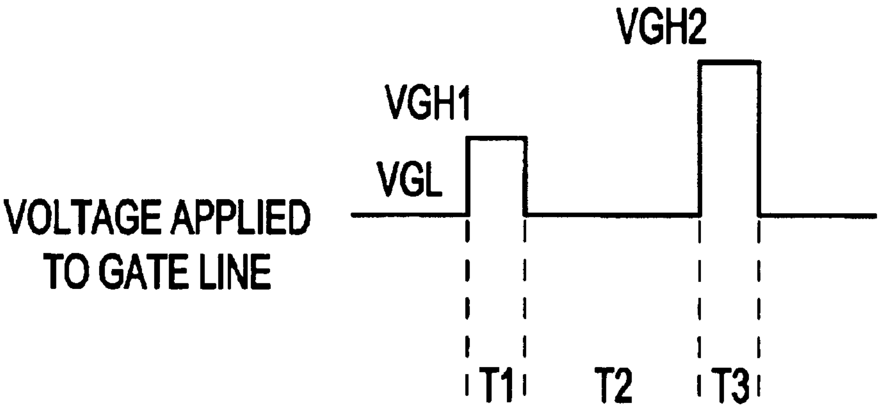
FIG. 2A shows voltages VGH1 and VGH2 applied to gate lines when the voltage VGH2 is higher than the voltage VGH1.

As shown in FIGS. 1 and 2A, an inspecting apparatus 10 comprises means for applying a first voltage VGH1 to the switching element 16 when electric charges are accumulated in the storage capacitor 26 and the gate-electrode capacitor 24.

Further, the inspecting apparatus 10 comprises means for applying a second voltage VGH2 having a different voltage value than the first voltage VGH1 has to the switching element 16 so as to turn on the switching element 16 when the electric charges accumulated in the storage capacitor 26 and the gate-electrode capacitor 24 are read.

The means for applying a first voltage VGH1 and the means for applying a second voltage VGH2 are in a gate voltage generating circuit 28 and, the one means is used in the write operation and the other is used in the read operation. Alternatively, the gate voltage generating circuit 28 may generate the first voltage VGH1 in the write operation and the second voltage VGH2 in the read operation.

As shown in FIG. 2A, the second voltage VGH2 is higher than the first voltage VGH1. For example, if the second voltage VGH2 is twice as high as the first voltage VGH1, the difference in electric charge between the normal pixel and the defective pixel is 20%, which is sufficient to judge that Cdg falls outside the normal range.

Figure 2B:
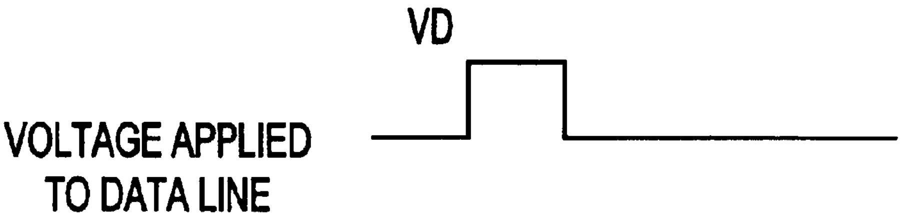
FIG. 2B shows a voltage VD applied to data lines.

The inspecting apparatus 10 further comprises a write circuit 30 for applying a write voltage VD shown in FIG. 2B to the data line 14 so as to accumulate electric charges when the first voltage VGH1 is applied. The write voltage VD is applied to the data line 14 at least while the first voltage VGH1 is applied to the gate line 12.

The inspecting apparatus 10 further comprises a read circuit 32 for reading the accumulated electric charges when the second voltage VGH2 is applied.

The gate voltage generating circuit 28 is connected to a pad 34 of the gate line 12 via a probe 38. The write circuit 30 and the read circuit 32 are selectively connected to the data line 14 by a switch 42. The switch 42 is connected to a pad 36 of the gate line 14.

In the inspecting method, (i) a voltage is applied to the data line 14 so as to accumulate electric charges in a pixel; and (ii) the switching element 16 is turned on by applying the first voltage VGH1 to the switching element 16 so as to turn on the switching element 16 so as to accumulate electric charges in the storage capacitor 26 and the gate-electrode capacitor 24. When the switching element is turned on, electric charges are accumulated in the storage capacitor 26 and the gate-electrode capacitor 24.

Then, (iii) the electric charges are retained in the capacitors 24 and 26 for a certain period of time.

After that, (iv) the switching element 16 is turned on by applying the second voltage VGH2 having a different voltage value than the first voltage has to the switching element 16 so as to read the electric charges retained in the storage capacitor 26 and the gate-electrode capacitor 24, and (v) the switch 42 is connected to the read circuit 32 and the accumulated electric charge is read while the switching element 16 is on.

Figure 4A:
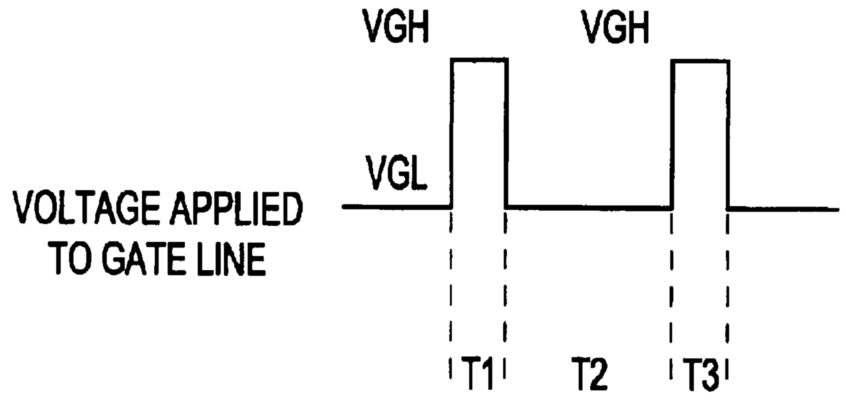
FIG. 4A shows a voltage applied to gate lines.
Figure 4B:
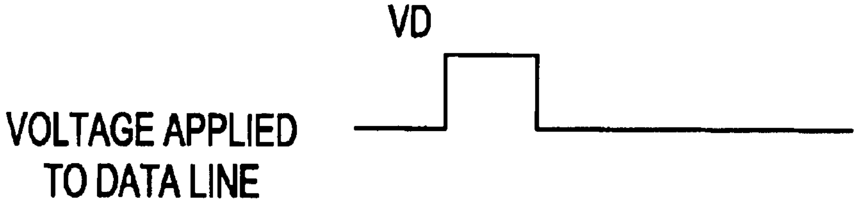
FIG. 4B shows a voltage VD applied to data lines in a conventional inspecting apparatus.

When the electric charges are written (T1), the conditions of the electric charges are expressed by Qgd=Cgd (VD−VGH1) and Qcs=Cs (VD−VCs). In this specification, the phrase "electric charges are written" means that electric charges are accumulated in capacitors. In addition, VD indicates a write voltage to be applied to the data line 14 shown in FIG. 4B and Vcs indicates a voltage of a storage capacitor (Cs) line 20.

When the electric charges are retained (T2), the conditions of the electric charges are expressed by Qgd=Cgd (VITO−VGL) and Qcs=Cs (VITO−VCs), wherein VGL is set to −5V.

When the electric charges are read (T3), the conditions of the electric charges are expressed by Qgd=Cgd (GND−VGH2) and Qcs=Cs (GND−VCs).

The amount of electric charge Q to be detected in the inspection of the array substrate is obtained by subtracting the total amount of electric charges in a read operation from the total amount of electric charges in a write operation, and is expressed by Q=VD (Cs+Cgd)+Cgd(VGH2−VGH1).

If Cs is 0.1 pF, Cgd is 0.01 pF, a write voltage VD is 10 V, the first voltage VGH1 is 15 V and the second voltage VGH2 is 30 V, the electric charge Q to be detected in a normal pixel is 1.25 pC.

In a defective pixel, Cgd is 0.02 pF, which is twice as much as that in a normal pixel, and the electric charge Q is 1.5 pC. In this case, the difference in electric charge between the normal pixel and the defective pixel is 20%. Therefore, unlike the conventional invention, it is possible in the present invention to judge that Cdg falls outside the normal range.

In the conventional invention, it is difficult to detect that the capacitance of the gate-electrode capacitance 24 falls outside the normal range. However, the present invention makes it possible to detect this. By adjusting a gate voltage, it is easy to detect that the capacitance falls outside the normal range.

Figure 2C:
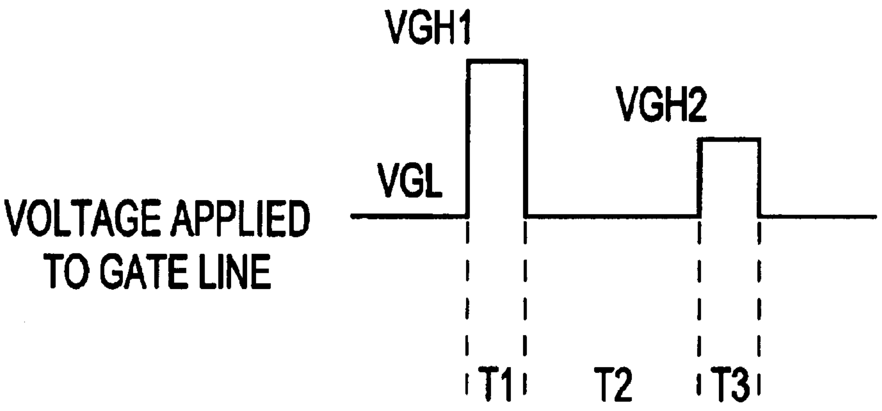
FIG. 2C shows voltages VGH1 and VGH2 applied to the gate lines in the case where the voltage VGH1 is higher than the voltage VGH2.
Figure 3:
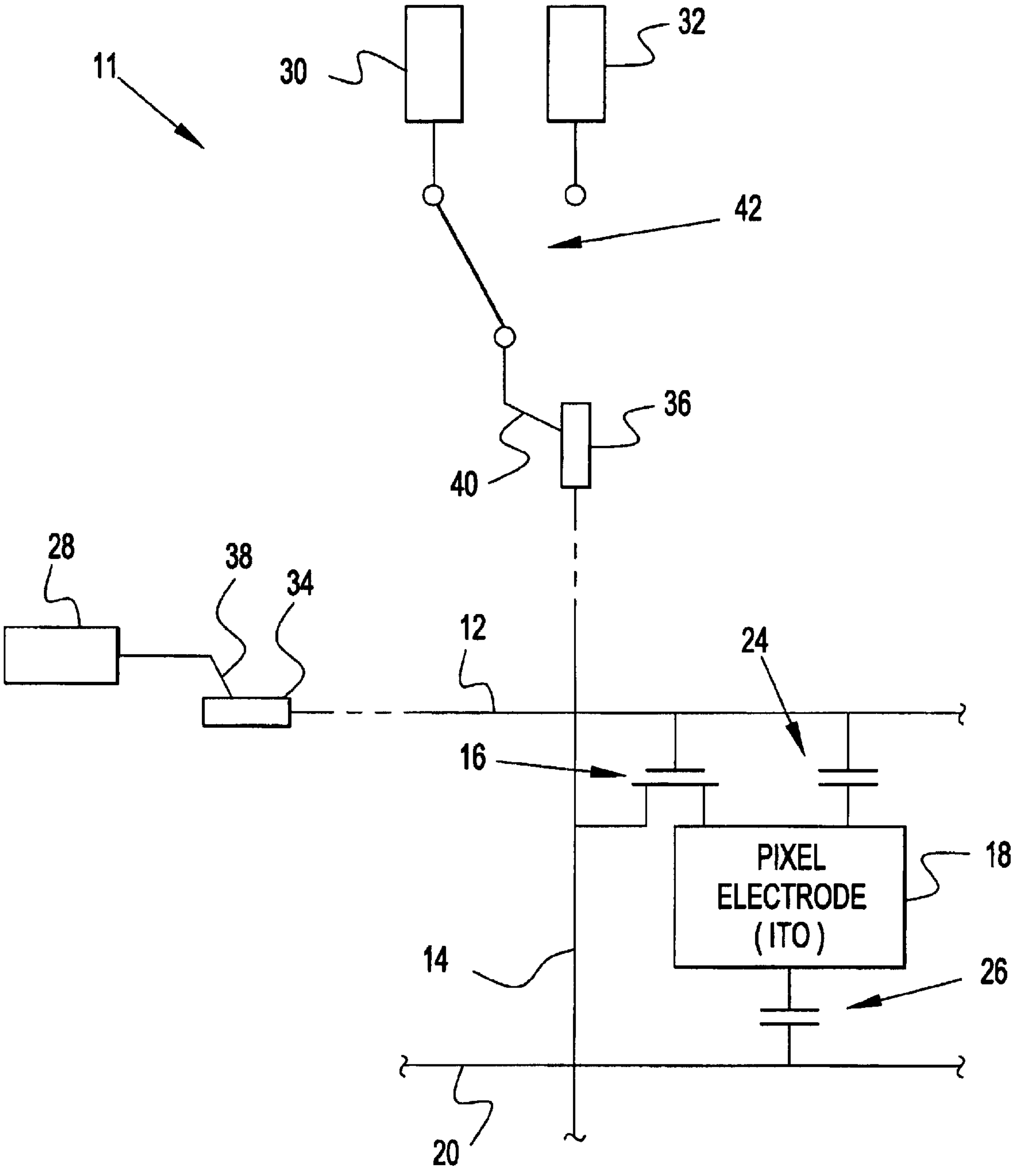
FIG. 3 shows an embodiment of a conventional apparatus for inspecting an array substrate and a pixel circuit for a liquid crystal display.

As shown in FIG. 2C, the first voltage VGH1 may be higher than the second voltage VGH2. In this case, the electric charge Q to be detected is expressed by Q=VD(Cs+Cgd)−Cgd(VGH2−VGH1).

In the aforementioned description, the capacitance of the data-electrode capacitance 44 is neglected.

Figure 5:
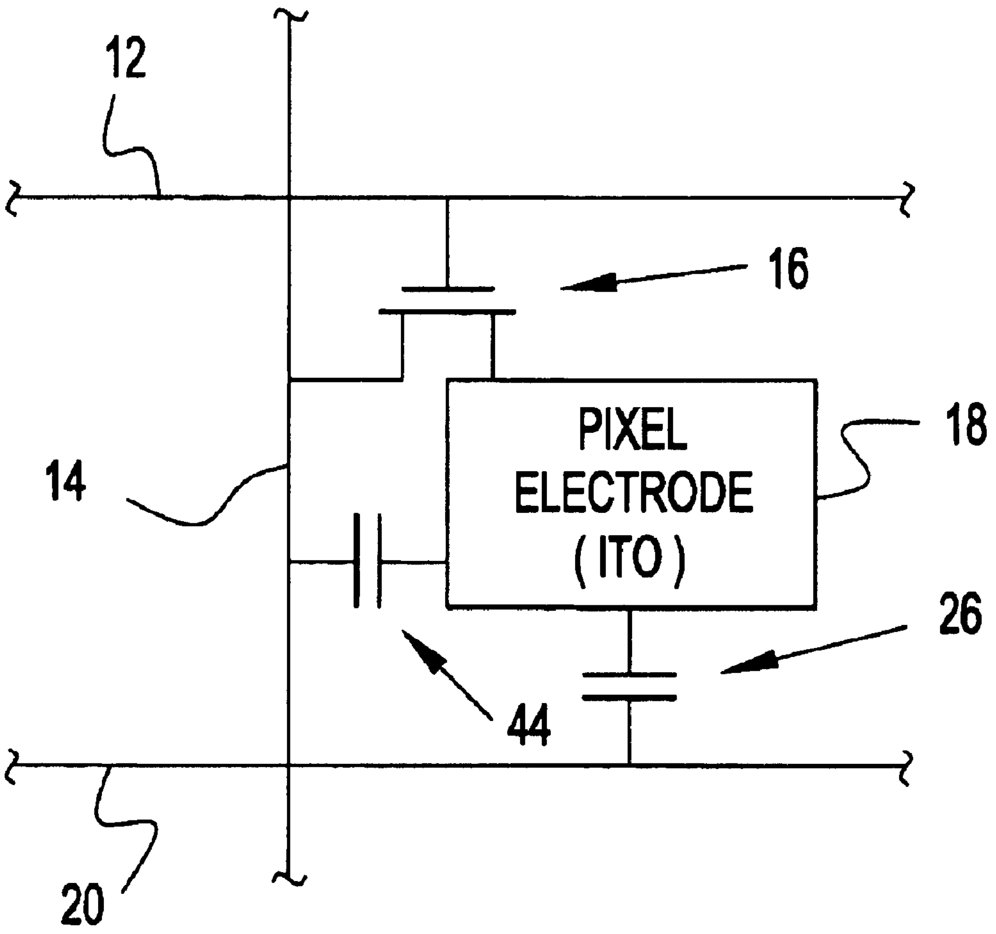
FIG. 5 shows a data-electrode capacitor.

Next, the data-electrode capacitor 44 shown in FIG. 5 will be described. VGH1 is set to a sufficiently low value, for example, VD−5V or less, to make VITO and VD different. In other words, means for adjusting the first voltage VGH1 is provided to the gate voltage generating circuit 28 to make VITO and VD different. At the result, the electric charge Q to be detected is expressed by Q=Cs(VITO−GND)+Cdd (VITO−VD). Since VITO and VD are different, an electric charge is accumulated in the data-electrode capacitor 44, which ensures the inspection of an array substrate including the detection of a data-electrode capacitor 44.

While the embodiments of the present invention have thus been described with reference to the drawings, it should be understood that the present invention be not limited to the embodiments. Many changes, modifications, variations and other uses and applications can be made to the embodiments on the basis of knowledge of those skilled in the art without departing from the scope of the present invention.

What is claimed is:

1. An apparatus for inspecting an array substrate comprising a substrate, a plurality of gate lines provided on the substrate, a plurality of data lines that cross the gate lines, switching elements provided near the intersections of the gate lines and the data lines and connected to the gate lines and data lines, pixel electrodes connected to the switching elements, storage capacitor lines that form storage capacitors by facing a part of each pixel electrode, and gate-electrode capacitors formed between the gate lines and the pixel electrodes, comprising:

first voltage source for applying a first voltage to the switching elements so as to turn on the switching elements when electric charges are accumulated in the storage capacitors and the gate-electrode capacitors; and second voltage source for applying a second voltage to the switching elements so as to turn on the switching elements when the electric charges accumulated in the storage capacitors and the gate-electrode capacitors are read, said second voltage having a different voltage value than the first voltage.

2. The apparatus according to claim 1, wherein said second voltage is higher than said first voltage.

3. The apparatus according to claim 2, wherein said second voltage is twice as high as said first voltage.

4. The apparatus according to claim 1, further comprising means for applying a voltage to the data lines for accumulating the electric charges when the first voltage is applied.

5. The apparatus according to claim 1, further comprising means for reading the accumulated electric charges when the second voltage is applied.

6. The apparatus according to claim 1, further comprising means for adjusting a voltage applied to the data lines and a voltage applied to the pixel electrodes so that they are different from each other.

7. A method for inspecting an array substrate comprising a substrate, a plurality of gate lines provided on the substrate, a plurality of data lines that cross the gate lines, switching elements provided near the intersections of the gate lines and the data lines and connected to the gate lines and data lines, pixel electrodes connected to the switching elements, storage capacitor lines that form storage capacitors by facing a part of the each pixel electrode, and gate-electrode capacitors formed between the gate lines and the pixel electrodes, comprising the steps of:

applying a first voltage to the switching elements when electric charges are accumulated in the storage capacitors and the gate-electrode capacitors; and applying a second voltage to the switching elements so as to turn on the switching elements when the electric charges accumulated in the storage capacitors and the gate-electrode capacitors are read, said second voltage having a different voltage value than the first voltage has.

8. The method according to claim 7, wherein said second voltage is higher than said first voltage.

9. The method according to claim 8, wherein said second voltage is twice as high as said first voltage.

10. The method according to claim 7, further comprising the step of applying a voltage for accumulating the electric charges to the data lines concurrently with the step of applying the first voltage.

11. The method according to claim 7, further comprising the step of reading the accumulated electric charges when the second voltage is applied.

12. The method according to claim 7, further comprising the step of adjusting a voltage applied to the data lines and a voltage applied to the gate lines so that they are different from each other.

* * * * *